(12) United States Patent
Park et al.

(10) Patent No.: US 11,871,633 B2
(45) Date of Patent: Jan. 9, 2024

(54) DISPLAY DEVICE AND TILED DISPLAY DEVICE INCLUDING THE SAME

(71) Applicant: Samsung Display Co., LTD., Yongin-si (KR)

(72) Inventors: Sae Ron Park, Hwaseong-si (KR); Kyung Min Kim, Hwaseong-si (KR); Jin Suek Kim, Hwaseong-si (KR); Jae Soo Jang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 282 days.

(21) Appl. No.: 17/480,709

(22) Filed: Sep. 21, 2021

(65) Prior Publication Data

US 2022/0208950 A1    Jun. 30, 2022

(30) Foreign Application Priority Data

Dec. 29, 2020   (KR) .................. 10-2020-0185622

(51) Int. Cl.
*H10K 59/18* (2023.01)
*H10K 59/38* (2023.01)
*H10K 59/126* (2023.01)

(52) U.S. Cl.
CPC ........... *H10K 59/18* (2023.02); *H10K 59/126* (2023.02); *H10K 59/38* (2023.02)

(58) Field of Classification Search
CPC ...... H10K 59/18; H10K 59/126; H10K 59/38; H10K 71/851; H10K 2102/331; H10K 50/865; H01L 25/167; H01L 25/0753; H01L 33/507; H01L 33/50; H01L 33/58; H01L 27/156; H01L 27/1214; G09F 9/33; G09F 9/3023; C09B 57/00
See application file for complete search history.

(56) References Cited

U.S. PATENT DOCUMENTS

2022/0309267 A1* 9/2022 Kim .................. G06V 40/1318

FOREIGN PATENT DOCUMENTS

| JP | 2019-82692 | 5/2019 |
|---|---|---|
| KR | 10-2017-0126912 | 11/2017 |
| KR | 10-2018-0126732 | 11/2018 |
| KR | 10-2020-0088797 | 7/2020 |
| KR | 10-2020-0090587 | 7/2020 |

* cited by examiner

*Primary Examiner* — Anne M Hines
*Assistant Examiner* — Jose M Diaz
(74) *Attorney, Agent, or Firm* — KILE PARK REED & HOUTTEMAN PLLC

(57) ABSTRACT

A display device includes a substrate including a display area including emission areas and a light blocking area; and a non-display area adjacent to the display area; a thin-film transistor layer disposed on the substrate and including thin-film transistors; a light-emitting element layer disposed on the thin-film transistor layer and including light-emitting elements; a wavelength conversion layer disposed on the light-emitting element layer that converts a peak wavelength of a light from at least a part of the of light-emitting elements; and a color filter layer disposed on the wavelength conversion layer, and including color filters corresponding to the emission areas and a first light blocking part corresponding to the light blocking area and the non-display area. A transmittance of the first light blocking part with respect to a light having a wavelength of about 1000 nm or more is about 80% or more.

20 Claims, 11 Drawing Sheets

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2020-0185622 under 35 U.S.C. § 119 filed on Dec. 29, 2020, in the Korean Intellectual Property Office, the entire contents of which are incorporated herein by reference.

BACKGROUND

1. Technical Field

The disclosure relates to a display device and a tiled display device including the same.

2. Description of the Related Art

With the advancement of the information society, demands for display devices for displaying images are increasing in various forms. For example, display devices have been applied to various types of electronic devices such as smart phones, digital cameras, notebook computers, navigation systems, and smart televisions. Display devices may be flat panel display devices such as a liquid crystal display device, a field emission display device, an organic light-emitting display device, and the like. Among flat panel displays, a light-emitting display device may include each pixel of a display panel which may include a light-emitting element capable of emitting light and thus may display an image without a backlight unit providing light to the display panel.

When a display device is manufactured in a large size, a defect rate of a light-emitting element may increase due to an increase in the number of pixels and productivity or reliability may decrease. To solve this problem, a tiled display device with a large-sized screen may be achieved by connecting display devices each having a relatively small size. The tiled display device may include boundary portions called seams between the display devices due to non-display areas or bezel areas of adjacent display devices. The boundary portions between the display devices give a sense of discontinuity to an entire screen when an image is displayed on the entire screen, thus reducing a sense of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which a heat-affected area of a light blocking part is minimized to reduce a tolerance of a cutting process, and a tiled display device including the same.

Aspects of the disclosure provide a tiled display device in which boundary portions between display devices or non-display areas are prevented from being recognized, thereby removing a sense of discontinuity between the display devices and improving a sense of immersion in an image.

According to an embodiment, a display device may include a substrate including a display area including emission areas and a light blocking area; and a non-display area adjacent to the display area; a thin-film transistor layer disposed on the substrate, the thin-film transistor layer comprising thin-film transistors; a light-emitting element layer disposed on the thin-film transistor layer, the light-emitting element layer comprising light-emitting elements; a wavelength conversion layer disposed on the light-emitting element layer that converts a peak wavelength of a light from at least a part of the light-emitting elements; and a color filter layer disposed on the wavelength conversion layer, the color filter layer comprising color filters corresponding to the emission areas; and a first light blocking part corresponding to the light blocking area and the non-display area. A transmittance of the first light blocking part with respect to a light having a wavelength of about 1000 nm or more is about 80% or more.

The first light blocking part may comprise an organic black pigment and an organic blue pigment.

The organic black pigment may comprise lactam black, and the organic blue pigment may comprise C. I. Pigment Blue 15:6.

A ratio of an amount of the organic black pigment to an amount of the organic blue pigment in the first light blocking part may be about 3:1 to about 4:1.

A pigment weight concentration of the organic black pigment and the organic blue pigment of the first light blocking part may be about 25% or less.

The first light blocking part may have a thickness in a range of about 3 μm to about 12 μm.

A transmittance of the first light blocking part with respect to a light having a wavelength in a range of about 1000 nm to about 1100 nm may be about 87% or more.

The first light blocking part may comprise an organic black pigment of lactam black.

A pigment weight concentration of the organic black pigment may be about 6% or less.

The first light blocking part may have a thickness in a range of about 5 μm to about 12 μm.

A transmittance of the first light blocking part with respect to a light having a wavelength in a range of about 1000 nm to about 1100 nm may be about 92% or more.

The wavelength conversion layer may comprise a wavelength converter corresponding to a part of the emission areas; a light transmitter corresponding to another part of the emission areas; and a second light blocking part surrounding the wavelength converter and the light transmitter in a plan view.

The first light blocking part may be disposed on the second light blocking part in the light blocking area, and disposed in the non-display area to surround a side surface of the wavelength conversion layer.

According to an embodiment, a tiled display device may include display devices including a display area including emission areas and a light blocking area; and a non-display area adjacent to the display area; and a coupling member that combines the display devices. Each of the plurality of display devices may include a substrate; a thin-film transistor layer disposed on the substrate, the thin film transistor layer comprising thin-film transistors; a light-emitting element layer disposed on the thin-film transistor layer, the light-emitting element layer comprising light-emitting elements; a wavelength conversion layer disposed on the light-emitting element layer, and converting a peak wavelength of a light from at least a part of the light-emitting elements; and a color filter layer disposed on the wavelength conversion layer, the color filter layer comprising color filters corresponding to the emission areas and a first light blocking part corresponding to the light blocking area and the non-display area. A transmittance of the first light blocking part with respect to a light having a wavelength of about 1000 nm or more is about 80% or more.

The first light blocking part may comprise an organic black pigment of lactam black and an organic blue pigment of C. I. Pigment Blue 15:6.

A ratio of an amount of the organic black pigment to an amount of the organic blue pigment in the first light blocking part may be about 3:1 to about 4:1.

A pigment weight concentration of the organic black pigment and the organic blue pigment of the first light blocking part may be about 25% or less.

The first light blocking part may comprise an organic black pigment of lactam black.

A pigment weight concentration of the organic black pigment may be about 6% or less.

Side surfaces of the substrates of each of the adjacent display devices, side surfaces of the thin-film transistor layer of each of the adjacent display devices, side surfaces of the light-emitting element layer of each of the adjacent display devices, and side surfaces of the color filter layer of each of the adjacent display devices adjacent display devices may be combined by the coupling member.

It should be noted that objects of the disclosure are not limited thereto and other objects of the disclosure will be apparent to those skilled in the art from the following description.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
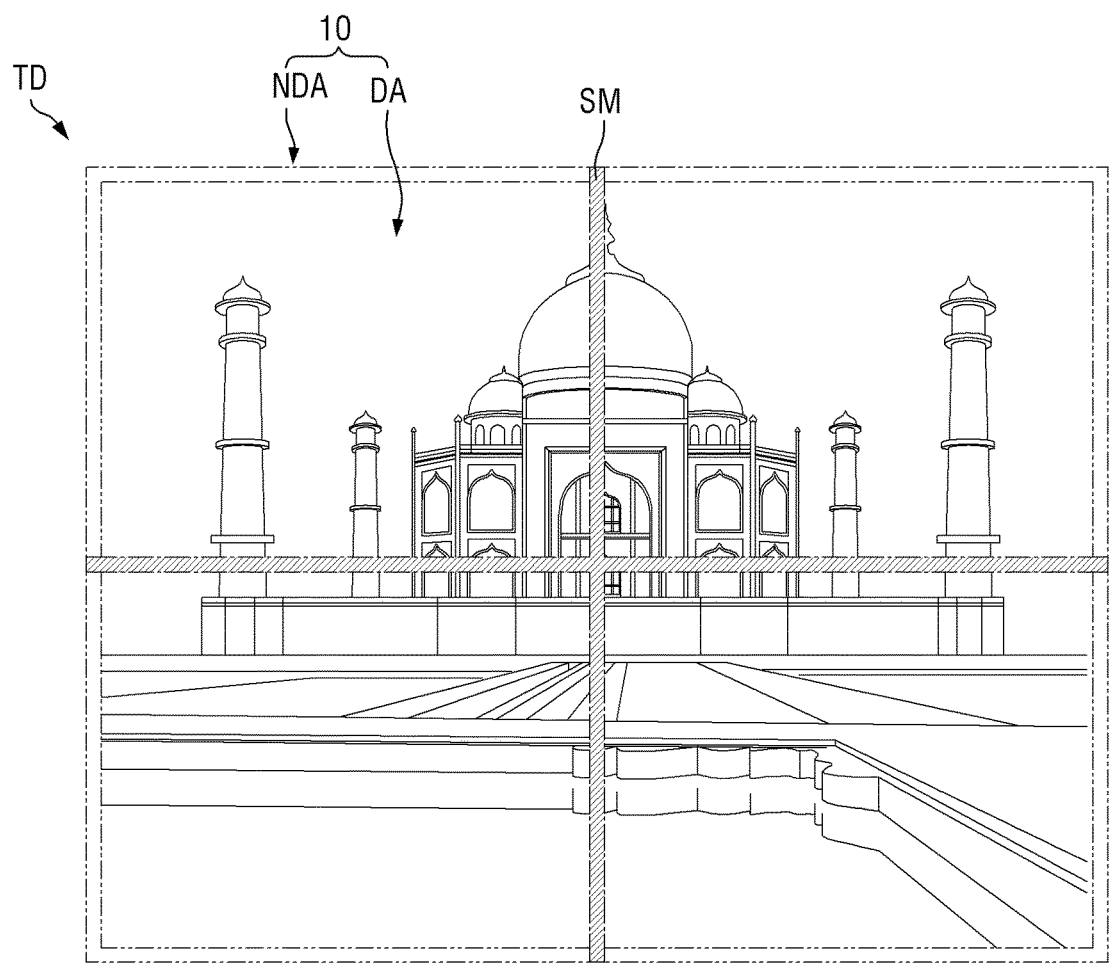
FIG. 1 is a schematic plan view of a tiled display device according to an embodiment.
Figure 1:
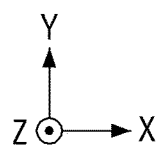

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the concepts disclosed herein. It is apparent, however, that various embodiments may be practiced without these enumerated details or with one or more equivalent arrangements. In other instances, related art structures and devices may be shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless so specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing particular embodiments and is not intended to be limiting. As used herein, the singular forms, "a," "an," and "the" are intended to include the plural forms as well, unless the context clearly indicates otherwise.

Moreover, the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As would be appreciated by one of ordinary skill in the art, some embodiments are described and illustrated in the accompanying drawings in terms of functional blocks, units, and/or modules. Those skilled in the art will appreciate that these blocks, units, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of a tiled display device according to an embodiment.

Referring to FIG. 1, a tiled display device TD may include display devices 10. The display devices 10 may be arranged or disposed in a grid pattern but is not limited thereto. The display devices 10 may be connected in a first direction (X-axis direction) or a second direction (Y-axis direction), and the tiled display device TD may have a specific or given shape. For example, the display devices 10 may have the same size but are not limited thereto. As another example, the display devices 10 may have different sizes.

Each of the display devices 10 may have a substantially rectangular shape including long sides and short sides. The display devices 10 may be arranged or disposed such that the long sides or short sides thereof are connected to each other. Some or a number of or part of the display devices 10 may be disposed at an edge of the tiled display device TD to form one side or a side of the tiled display device TD. Some or a number of or part of the display devices 10 may be disposed at edges of the tiled display device TD and form two adjacent sides of the tiled display device TD. Some or a number of or part of the display devices 10 may be disposed inside the tiled display device TD and surrounded by other display devices 10.

Each of the display devices 10 may include a display area DA and a non-display area NDA. The display area DA may include pixels for displaying an image. Each of the pixels may include an organic light-emitting diode (OLED) including an organic emission layer, a micro LED, a quantum dot LED including a quantum dot emission layer, or an inorganic light-emitting element including an inorganic semiconductor. A case in which each of the pixels may include an inorganic light-emitting element will be described below but embodiments are not limited thereto. The non-display area NDA may be provided or disposed near the display area DA to surround or to be adjacent to the display area DA and may not display an image.

The tiled display device TD may have an overall substantially planar shape but is not limited thereto. The tiled display device TD may have a three-dimensional (3D) shape to provide a 3D effect to a user. For example, in case that the tiled display device TD has the 3D shape, at least some or a number of or part of the display devices 10 may have a substantially curved shape. As another example, the display devices 10 may each have a substantially planar shape and may be connected to each other at a certain or given angle and thus the tiled display device TD may have the 3D shape.

The tiled display device TD may include a combining area SM between the display areas DA. The tiled display device TD may be formed by connecting the non-display areas NDA of adjacent display devices 10. The display devices 10 may be connected to each other through a coupling member or an adhesive member provided or disposed in the combining area SM. The combining area SM of each of the display devices 10 may not include a pad portion or a flexible film attached to the pad portion. Accordingly, the distance between the display areas DA of the display devices 10 may be so small that the combining area SM between the display devices 10 is not recognizable to a user. The reflectance of external light of the display area DA of each of the display devices 10 and the reflectance of external light of the combining area SM between the display devices 10 may be substantially the same. Accordingly, in the tiled display device TD, the combining area SM between the display devices 10 may be prevented from being recognized by a user, thereby reducing a sense of discontinuity between the display devices 10 and improving a sense of immersion in an image.

Figure 2:
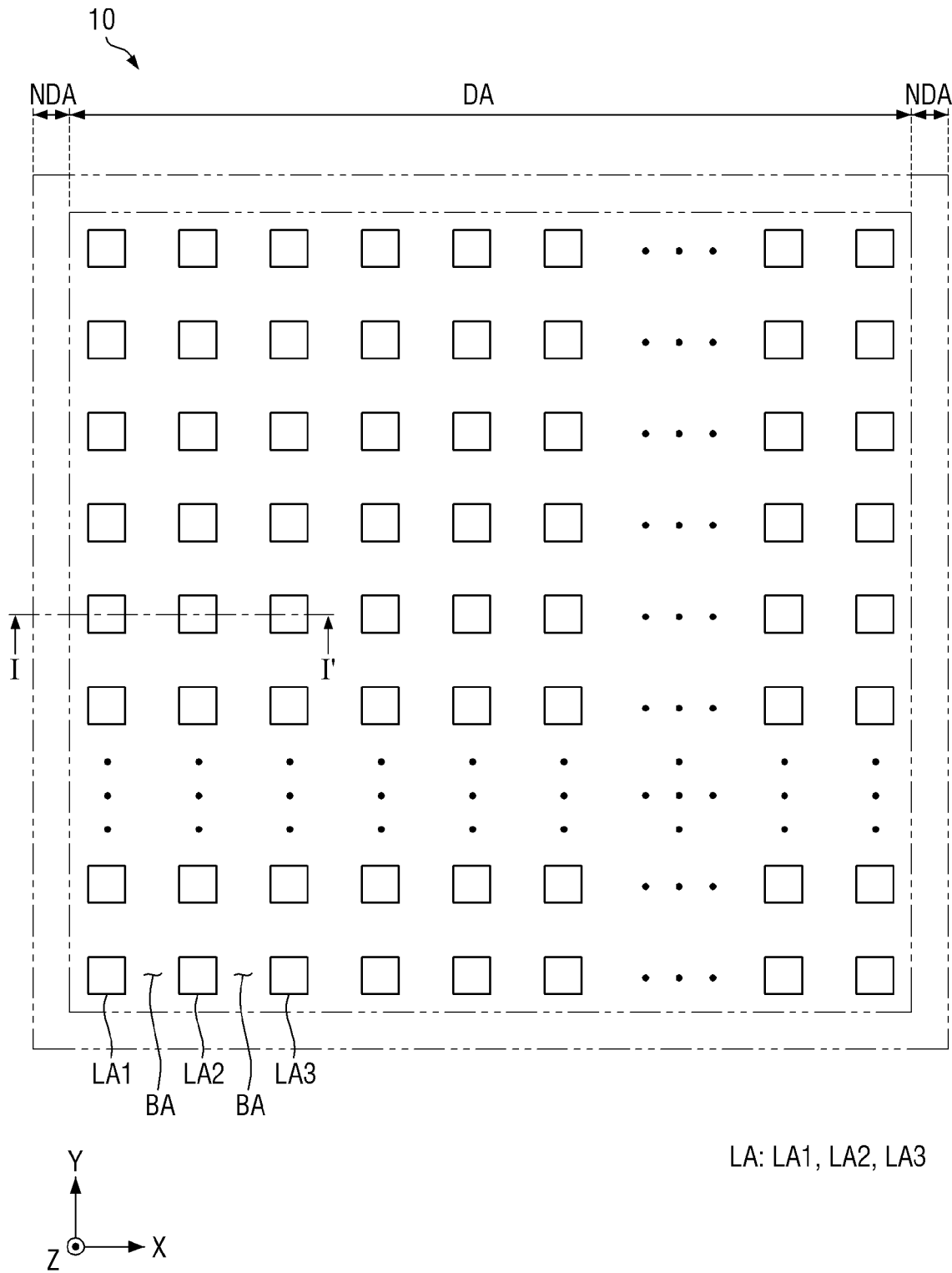
FIG. 2 is a schematic plan view of a display device according to an embodiment.

FIG. 2 is a schematic plan view of a display device according to an embodiment.

Referring to FIG. 2, a display device 10 may include pixels arranged or disposed in rows and columns in a display area DA. Each of the pixels may include an emission area LA defined by a pixel defining film or bank, and light having a certain or given peak wavelength may be emitted through the emission area LA. For example, the display area DA of the display device 10 may include a first emission area LA1, a second emission area LA2, and a third emission area LA3. Each of the first to third light emitting areas LA1, LA2, and LA3 may be areas through which light generated by a light-emitting element of the display device 10 is emitted to the outside of the display device 10.

The first to third emission areas LA1, LA2, and LA3 may emit light having a certain or given peak wavelength to the outside of the display device 10. The first emission area LA1 may emit light of a first color, the second emission area LA2 may emit light of a second color, and the third emission area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm, but embodiments are not limited thereto.

The first to third emission areas LA1, LA2, and LA3 may be sequentially and repeatedly disposed in a first direction (X-axis direction) of the display area DA. For another example, an area of the first emission area LA1 may be greater than that of the second emission area LA2, and the area of the second emission area LA2 may be greater than that of the third emission area LA3. As another example, the area of the first emission area LA1, the area of the second emission area LA2, and the area of the third emission area LA3 may be substantially the same.

The display area DA of the display device 10 may include a light blocking area BA surrounding the emission areas LA. The light blocking area BA may prevent light emitted from the first to third emission areas LA1, LA2, and LA3 from being mixed.

Figure 3:
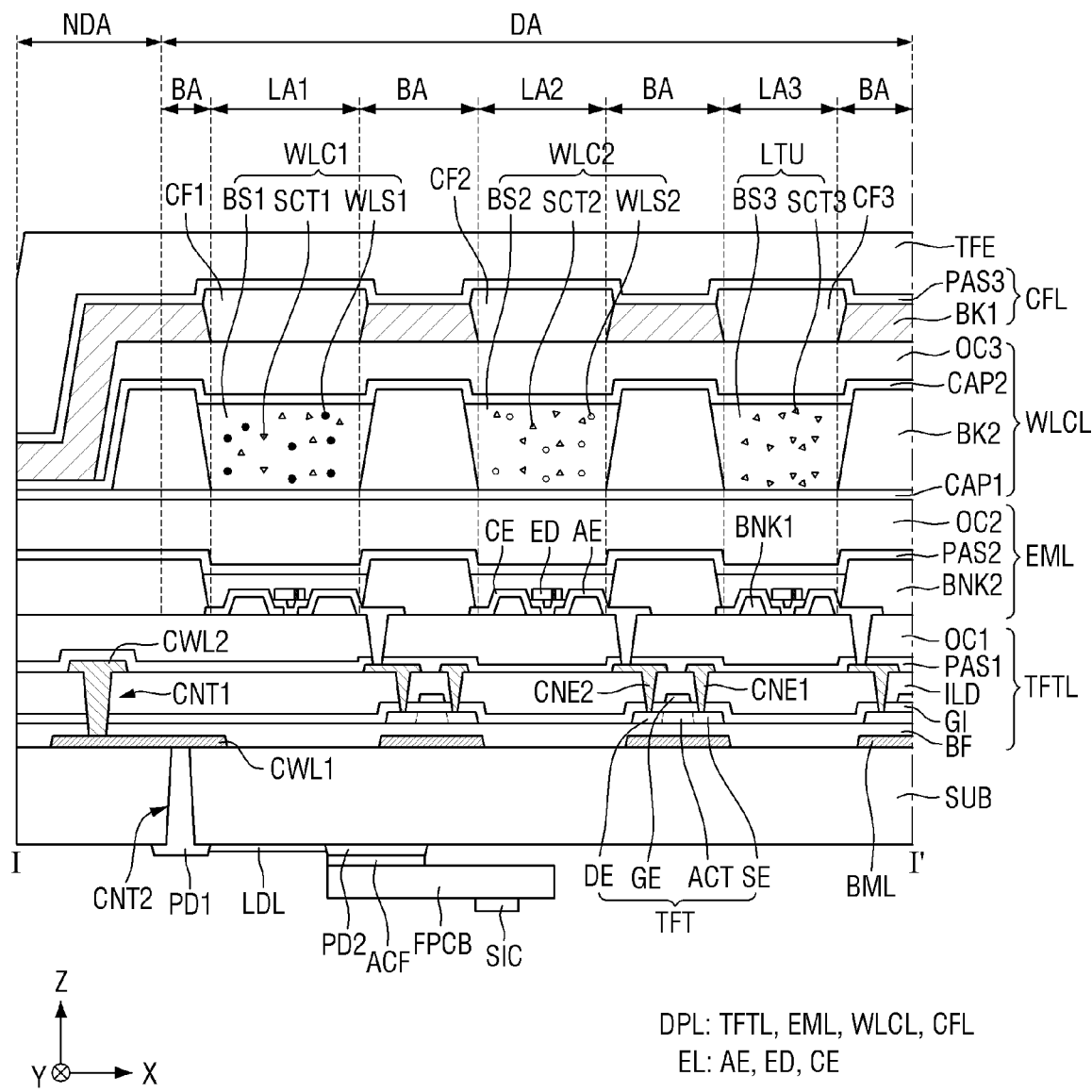
FIG. 3 is a schematic cross-sectional view taken along line I-I' of FIG. 2.

FIG. 3 is a schematic cross-sectional view taken along line I-I' of FIG. 2.

Referring to FIG. 3, the display area DA of the display device 10 may include the first emission area LA1, the second emission area LA2, and the third emission area LA3. The first to third emission areas LA1, LA2, and LA3 may be areas through which light generated by a light-emitting diode ED of the display device 10 is emitted to the outside of the display device 10.

The display device 10 may include a substrate SUB, a display layer DPL, an encapsulation layer TFE, a first pad portion PD1, a lead line LDL, a second pad portion PD2, a flexible film FPCB, and a data driver SIC.

The substrate SUB may be a base substrate or a base member. The substrate SUB may support the display device 10. The substrate SUB may include the display area DA including the first to third emission areas LA1, LA2, and LA3 and the light blocking area BA, and the non-display area NDA surrounding or adjacent to the display area DA. For example, the substrate SUB may include a glass material but is not limited thereto. As another example, the substrate SUB may include a polymer resin such as polyimide (PI).

The display layer DPL may be provided or disposed on the substrate SUB. The display layer DPL may include a thin-film transistor layer TFTL, a light-emitting element layer EML, a wavelength conversion layer WLCL, and a color filter layer CFL. The thin-film transistor layer TFTL may include a light blocking layer BML, a first connection line CWL1, a buffer layer BF, a thin-film transistor TFT, a gate insulating film GI, an interlayer insulating film ILD, and a first connection electrode CNE1, a second connection electrode CNE2, a second connection line CWL2, a first passivation layer PAS1, and a first planarization layer OC1.

The light blocking layer BML may be provided or disposed on the substrate SUB. The light blocking layer BML may overlap the thin-film transistor TFT in a thickness direction (Z-axis direction) to block external light incident on the thin-film transistor TFT. For example, the light blocking layer BML may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The first connection line CWL1 may be provided or disposed on the substrate SUB to be spaced apart from the light blocking layer BML. The first connection line CWL1 may be formed or disposed on a same layer as the light blocking layer BML by using the same material or similar material as the light blocking layer BML. One end or an end of the first connection line CWL1 may cover or overlap a second contact hole CNT2. One end or an end of the first connection line CWL1 may be electrically connected to the first pad portion PD1 and another end thereof may be electrically connected to the second connection line CWL2. The first connection line CWL1 may supply an electrical signal received from the first pad portion PD1 to the thin-film transistor layer TFTL through the second connection line CWL2.

The buffer layer BF may cover or overlap the light blocking layer BML, the first connection line CWL1, and the substrate SUB. The buffer layer BF may include a first contact hole CNT1 into which the second connection line CWL2 is inserted. The buffer layer BF may include an inorganic material for preventing the permeation of air or moisture. For example, the buffer layer BF may include alternately stacked inorganic films.

The thin-film transistor TFT may be disposed on the buffer layer BF and may form a pixel circuit of each of pixels. For example, the thin-film transistor TFT may be a driving transistor or a switching transistor of a pixel circuit. The thin-film transistor TFT may include a semiconductor region ACT, a gate electrode GE, a source electrode SE, and a drain electrode DE.

The semiconductor region ACT, the source electrode SE, and the drain electrode DE may be provided or disposed on the buffer layer BF. The semiconductor region ACT may overlap the gate electrode GE in a thickness direction and may be insulated from the gate electrode GE by the gate insulating film GI. The source electrode SE and the drain electrode DE may be formed by converting a material of the semiconductor region ACT into a conductor.

The gate electrode GE may be provided or disposed on the gate insulating film GI. The gate electrode GE and the semiconductor region ACT may overlap each other with the gate insulating film GI interposed therebetween.

The gate insulating film GI may be provided or disposed on the semiconductor region ACT, the source electrode SE, and the drain electrode DE. For example, the gate insulating film GI may cover or overlap the semiconductor region ACT, the source electrode SE, the drain electrode DE, and the buffer layer BF, and insulate the semiconductor region ACT and the gate electrode GE from each other. The gate insulating film GI may include the first contact hole CNT1 into which the second connection line CWL2 is inserted. The gate insulating film GI may include contact holes through the first and second connection electrodes CNE1 and CNE2 pass.

The interlayer insulating film ILD may be provided or disposed on the gate electrode GE. The interlayer insulating film ILD may include the first contact hole CNT1 into which the second connection line CWL2 is inserted. Accordingly, the first contact hole CNT1 may pass through the interlayer insulating film ILD, the gate insulating film GI, and the buffer layer BF. The interlayer insulating film ILD may include the contact holes through which the first and second connection electrodes CNE1 and CNE2 pass.

The first and second connection electrodes CNE1 and CNE2 may be provided or disposed on the interlayer insulating film ILD to be spaced apart from each other. The first connection electrode CNE1 may electrically connect a data line or a power line to the source electrode SE of the thin-film transistor TFT. The first connection electrode CNE1 may be in contact with the source electrode SE through the contact hole provided or disposed in the interlayer insulating film ILD and the gate insulating film GI.

The second connection electrode CNE2 may electrically connect the drain electrode DE of the thin-film transistor TFT and a first electrode AE of the light-emitting element EL. The second connection electrode CNE2 may be in electrical contact with the drain electrode DE through the contact hole provided or disposed in the interlayer insulating film ILD and the gate insulating film GI.

The second connection line CWL2 may be disposed on the interlayer insulating film ILD to be spaced apart from the first and second connection electrodes CNE1 and CNE2. The second connection line CWL2 may be formed on a same layer as the first and second connection electrodes CNE1 and CNE2 by using the same material or similar material as the first and second connection electrodes CNE1 and CNE2. The second connection line CWL2 may be inserted into the first contact hole CNT1 and electrically connected to the first connection line CWL1 disposed on the substrate SUB.

For example, the second connection line CWL2 may be electrically connected to the data line to supply a data voltage to the thin-film transistor TFT. As another example, the second connection line CLW2 may be electrically connected to the power line to supply a power supply voltage to the thin-film transistor TFT.

The first passivation layer PAS1 may cover or overlap the first and second connection electrodes CNE1 and CNE2, the second connection line CWL2, and the interlayer insulating film ILD. The first passivation layer PAS1 may protect the thin-film transistor TFT. The first passivation layer PAS1 may include a contact hole through which the first electrode AE of the light-emitting element EL passes.

The first planarization layer OC1 may be provided or disposed on the first passivation layer PAS1 to planarize an upper end of the thin-film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1. The first planarization layer OC1 may include an organic material.

The light-emitting element layer EML may include a light-emitting element EL, a first bank BNK1, a second bank BNK2, a second passivation layer PAS2, and a second planarization layer OC2.

The light-emitting element EL may be provided or disposed on the thin-film transistor layer TFTL. The light-emitting element EL may include the first electrode AE, a second electrode CE, and a light-emitting diode ED.

The first electrode AE may be provided or disposed on the first planarization layer OC1. For example, the first electrode AE may be provided or disposed on the first bank BNK1 on the first planarization layer OC1 to cover or overlap the first bank BNK1. The first electrode AE may be disposed to overlap one of the first to third emission areas LA1, LA2, and LA3 defined by the second bank BNK2. The first electrode AE may be electrically connected to the drain electrode DE of the thin-film transistor TFT through the second connection electrode CNE2. The first electrode AE may be an anode electrode of the light-emitting element EL but is not limited thereto.

The second electrode CE may be provided or disposed on the first planarization layer OC1 to be spaced apart from the first electrode AE. For example, the second electrode CE may be provided or disposed on the first bank BNK1 on the first planarization layer OC1 to cover or overlap the first bank BNK1. The second electrode CE may be disposed to overlap one of the first to third emission areas LA1, LA2, and LA3 defined by the second bank BNK2. For example, the second electrode CE may receive a low potential voltage supplied to all pixels from a low potential line. The second electrode CE may be a cathode electrode of the light-emitting element EL but is not limited thereto.

The light-emitting diode ED may be provided or disposed between the first electrode AE and the second electrode CE on the first planarization layer OC1. One end or an end of the light-emitting diode ED may be electrically connected to the first electrode AE and the other end or another end thereof may be electrically connected to the second electrode CE. The light-emitting diode ED may have a micrometer or nano-meter size and may be an inorganic light-emitting diode containing an inorganic material. The inorganic light-emitting diode may be aligned between two opposing electrodes according to an electric field formed in a direction between the two opposing electrodes.

For example, light-emitting diodes ED may include active layers containing the same material or similar material and thus emit light of the same wavelength band or light of the same color. Light emitted from the first to third emission areas LA1, LA2, and LA3 may have the same color. For example, the light-emitting diodes ED may emit light of a third color or blue light having a peak wavelength in a range of about 440 nm to about 480 nm. Accordingly, the light-emitting element layer EML may emit light of the third color or blue light.

The second bank BNK2 may be disposed in the light blocking area BA on the first planarization layer OC1. The second bank BNK2 may define the first to third emission areas LA1, LA2, and LA3. For example, the second bank BNK2 may surround the first to third emission areas LA1, LA2, and LA3 but is not limited thereto. The second bank BNK2 may separate and insulate the first electrodes AE or the second electrodes CE of light-emitting elements EL.

The second passivation layer PAS2 may be provided or disposed on the light-emitting elements EL and the second bank BNK2. The second passivation layer PAS2 may cover or overlap and protect the light-emitting elements EL. The second passivation layer PAS2 may prevent the permeation of impurities such as moisture or air from the outside to prevent damage to the light-emitting elements EL.

The second planarization layer OC2 may be provided or disposed on the second passivation layer PAS2 to planarize an upper end of the light-emitting element layer EML. For example, the second planarization layer OC2 may include an organic material.

The wavelength conversion layer WLCL may include a first capping layer CAP1, a second light blocking part BK2, a first wavelength converter WLC1, a second wavelength converter WLC2, a light transmitter LTU, and a second capping layer CAP2, and a third planarization layer OC3.

The first capping layer CAP1 may be provided or disposed on the second planarization layer OC2 of the light-emitting element layer EML. The first capping layer CAP1 may seal lower surfaces of the first and second wavelength converters WLC1 and WLC2 and the light transmitter LTU. For example, the first capping layer CAP1 may include an inorganic material.

The second light blocking part BK2 may be disposed in the light blocking area BA on the first capping layer CAP1. The second light blocking part BK2 may overlap the second bank BNK2 in the thickness direction. The second light blocking part BK2 may surround the first and second wavelength converters WLC1 and WLC2 and the light transmitter LTU on a plane. The second light blocking part BK2 may block the transmission of light. The second light blocking part BK2 may prevent differently colored light from entering and mixing between the first to third emission areas LA1, LA2, and LA3, thereby improving color reproducibility of the display device 10. The second light blocking part BK2 may be provided or disposed in a grid pattern surrounding the first to third emission areas LA1, LA2, and LA3 on a plane.

The first wavelength converter WLC1 may be provided or disposed in the first emission area LA1 on the first capping layer CAP1. The first wavelength converter WLC1 may be surrounded by the second light blocking part BK2. The first wavelength converter WLC1 may include a first base resin BS1, a first scatterer SCT1, and a first wavelength shifter WLS1.

The first base resin BS1 may include a material having relatively high light transmittance. The first base resin BS1 may be formed of a transparent organic material. For example, the first base resin BS1 may include at least one of organic materials such as an epoxy resin, an acrylic resin, a cardo resin, and an imide resin.

The first scatterer SCT1 may have a refractive index different from that of the first base resin BS1 and f an optical interface with the first base resin BS1. For example, the first scatterer SCT1 may include a light scattering material or light scattering particles that scatter at least a part of the transmitted light. For example, the first scatterer SCT1 may contain a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or organic particles such as an acrylic resin or a urethane resin. The first scatterer SCT1 may scatter light in a random direction regardless of an incident direction of incident light without substantially changing a peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in a range of about 610 nm to about 650 nm and emit the red light. The first wavelength shifter WLS1 may be quantum dots, a quantum rod, or a phosphor. The quantum dots may be a particulate matter that emits a color as electrons transition from a conduction band to a valence band.

A part of blue light provided from the light-emitting element layer EML may pass through the first wavelength converter WLC1 without being converted into red light by the first wavelength shifter WLS1. Among blue light provided from the light-emitting element layer EML, light incident on the first color filter CF1 without being converted by the first wavelength converter WLC1 may be blocked by the first color filter CF1. The red light converted from the blue light by the first wavelength converter WLC1 among the blue light provided from the light-emitting element layer EML may pass through the first color filter CF1 and may be emitted to the outside. Accordingly, the first emission area LA1 may emit the red light.

The second wavelength converter WLC2 may be provided or disposed in the second emission area LA2 on the first capping layer CAP1. The second wavelength converter WLC2 may be surrounded by the second light blocking part BK2. The second wavelength converter WLC2 may include a second base resin BS2, a second scatterer SCT2, and a second wavelength shifter WLS2.

The second base resin BS2 may include a material having relatively high light transmittance. The second base resin BS2 may be formed of a transparent organic material. For example, the second base resin BS2 may be formed of the same material or a similar material as the first base resin BS1 or at least one of the above-described materials as for the first base resin BS1.

The second scatterer SCT2 may have a refractive index different from that of the second base resin BS2, and form an optical interface with the second base resin BS2. For example, the second scatterer SCT2 may include a light scattering material or light scattering particles that scatter at least a part of the transmitted light. For example, the second scatterer SCT2 may be formed of the same material or similar material as the first scatterer SCT1 or one of the above-described materials as for the first scatterer SCT1.

The second wavelength shifter WLS2 may convert or shift a peak wavelength of incident light into a second peak wavelength different from the first peak wavelength of the first wavelength shifter WLS1. For example, the second wavelength shifter WLS2 may convert blue light provided from the display device 10 into green light having a single peak wavelength in a range of about 510 nm to about 550 nm and emit the green light. The second wavelength shifter WLS2 may be quantum dots, a quantum rod, or a phosphor. The second wavelength shifter WLS2 may include a material having the same effect as the material for the first wavelength shifter WLS1. The second wavelength shifter WLS2 may be formed of quantum dots, a quantum rod, or a phosphor so that a wavelength conversion range thereof may be different from that of the first wavelength shifter WLS1.

The light transmitter LTU may be disposed in the third emission area LA3 on the first capping layer CAP1. The light transmitter LTU may be surrounded by the second light blocking part BK2. The light transmitter LTU may transmit incident light while maintaining a peak wavelength of the incident light. The light transmitter LTU may include a third base resin BS3 and a third scatterer SCT3.

The third base resin BS3 may include a material having relatively high light transmittance. The third base resin BS3 may be formed of a transparent organic material. For example, the third base resin BS3 may be formed of the same material or similar material as the first or second base resin BS1 or BS2 or at least one of the above-described materials for the first or second base resin BS1 or BS2.

The third scatterer SCT3 may have a refractive index different from that of the third base resin BS3 and form an optical interface with the third base resin BS3. For example, the third scatterer SCT3 may include a light scattering material or light scattering particles that scatter at least a part of the transmitted light. For example, the third scatterer SCT3 may be formed of the same material or similar material as the first or second scatterer SCT1 or SCT2 or one of the above-described material for the first or second scatterer SCT1 or SCT2.

The wavelength conversion layer WLCL may be disposed on or directly disposed on the second planarization layer OC2 of the light-emitting element layer EML and thus the display device 10 may not need a separate substrate for the first and second wavelength converters WLC1 and WLC2 and the light transmitter LTU. Accordingly, the first and second wavelength converters WLC1 and WLC2 and the light transmitter LTU may be easily and respectively aligned to the first to third emission areas LA1, LA2, and LA3, thus relatively reducing a thickness of the display device 10.

The second capping layer CAP2 may cover or overlap the first and second wavelength converters WLC1 and WLC2, the light transmitter LTU, and the second light blocking part BK2. The second capping layer CAP2 may cover or overlap outermost sides of the second light blocking part BK2 and an upper surface of the first capping layer CAP1 in the non-display area NDA. For example, the second capping layer CAP2 may seal the first and second wavelength converters WLC1 and WLC2 and the light transmitter LTU, thereby preventing damage to or contamination of the first and second wavelength converters WLC1 and WLC2 and the light transmitter TU. For example, the second capping layer CAP2 may include an inorganic material.

The third planarization layer OC3 may be provided or disposed on the second capping layer CAP2 to planarize upper ends of the first and second wavelength converters WLC1 and WLC2 and the light transmitter LTU. For example, the third planarization layer OC3 may include an organic material.

The color filter layer CFL may include a first light blocking part BK1, first to third color filters CF1, CF2, and CF3, and a third passivation layer PAS3.

The first light blocking part BK1 may be provided or disposed in the light blocking area BA on the third planarization layer OC3 of the wavelength conversion layer WLCL. The first light blocking part BK1 may overlap the second light blocking part BK2 or the second bank BNK2 in the thickness direction. The first light blocking part BK1 may cover or overlap a side surface of the third planarization layer OC3 and an upper surface of the second capping layer CAP2 in the non-display area NDA. The first light blocking part BK1 may be provided or disposed in the non-display area NDA to surround a side surface of the wavelength conversion layer WLCL. The first light blocking part BK1 may block the transmission of light. The first light blocking part BK1 may prevent differently colored light from entering and mixing between the first to third emission areas LA1, LA2, and LA3, thereby improving color reproducibility of the display device 10. The first light blocking part BK1 may be provided or disposed in a grid pattern surrounding the first to third emission areas LA1, LA2, and LA3 on a plane.

For example, the first light blocking part BK1 may include an organic black pigment and an organic blue pigment. The organic black pigment may include lactam black, perylene black, or aniline black, and for example, lactam black. The organic blue pigment may include at least one of C. I. Pigment Blue 15, 15:3, 15:4, 15:6, and 60, and for example, C. I. Pigment Blue 15:6.

A ratio of an amount of the organic black pigment to an amount of the organic blue pigment in the first light blocking part BK1 may be 3:1 to 4:1. A pigment weight concentration (PWC) of each of the organic black pigment and the organic blue pigment of the first light blocking part BK1 may be about 25% or less. For example, the PWC of the organic black pigment of the first light blocking part BK1 may be about 18%, and the PWC of the organic blue pigment may be about 5%. The ratio of the organic black pigment to the organic blue pigment may be 3.6:1 and the PWC of each of the organic black pigment and the organic blue pigment may be about 23%, but embodiments are not limited thereto.

The first light blocking part BK1 may block visible light and transmit infrared rays. A transmittance of the first light blocking part BK1 with respect to light having a wavelength of about 700 nm or less may be about 5% or less, and a transmittance thereof with respect to light having a wavelength of about 1000 nm or more may be about 80% or more. A transmittance of the first light blocking part BK1 with respect to light having a wavelength in a range of about 1000 nm to about 1100 nm may be about 87% or more. A thickness of the first light blocking part BK1 may be in a range of about 3 µm to about 12 µm, and for example, a range of about 3 µm to about 10 µm.

The first light blocking part BK1 may be cut in the thickness direction (Z-axis direction) by a cutting process using an infrared laser during the manufacture of the display device 10. Because the first light blocking part BK1 transmits infrared rays, in case that infrared laser is emitted to the first light blocking part BK1, a region to which heat of the infrared laser is transmitted and a region which may be damaged by the infrared laser may be minimized. As the transmittance of the first light blocking part BK1 with respect to infrared rays increases, a region which may be damaged by laser may be reduced. Accordingly, the display device 10 may include the first light blocking part BK1 having a transmittance of about 87% or more with respect to light having a wavelength in a range of about 1000 nm to about 1100 nm and thus a region of the first light blocking part BK1 which may be damaged by a laser cutting process may be minimized, thereby reducing a tolerance of the laser cutting process and minimizing an area of the non-display area NDA.

As another example, the first light blocking part BK1 may include an organic black pigment. The organic black pigment may include lactam black, perylene black, or aniline black, and for example, lactam black. A PWC of the organic black pigment of the first light blocking part BK1 may be about 6% or less, and for example, about 4% or less. The first light blocking part BK1 may block visible light and transmit infrared rays. A transmittance of the first light blocking part BK1 with respect to light having a wavelength of about 650 nm or less may be about 12% or less and a transmittance thereof with respect to light having a wavelength of about 1000 nm or more may be about 90% or more. A transmittance of the first light blocking part BK1 with respect to light having a wavelength in a range of about 1000 nm to about 1100 nm may be about 92% or more. A thickness of the first light blocking part BK1 may be in a range of about 5 µm to about 12 µm, and for example, a range of about 5 µm to about 10 µm.

The first light blocking part BK1 may be cut in the thickness direction (Z-axis direction) by a cutting process using an infrared laser during the manufacture of the display device 10. Because the first light blocking part BK1 transmits infrared rays, in case that infrared laser is emitted to the first light blocking part BK1, a region to which heat of the infrared laser is transmitted and a region which may be damaged by the infrared laser may be minimized. As the transmittance of the first light blocking part BK1 with respect to infrared rays increases, a region which may be damaged by laser may be reduced. Accordingly, the display device 10 may include the first light blocking part BK1 having a transmittance of about 92% or more with respect to light having a wavelength in a range of 1000 nm to about 1100 nm and thus a region of the first light blocking part BK1 which may be damaged by a laser cutting process may be minimized, thereby reducing a tolerance of the laser cutting process and minimizing an area of the non-display area NDA.

The first color filter CF1 may be disposed in the first emission area LA1 on the third planarization layer OC3. The first color filter CF1 may be surrounded by the first light blocking part BK1. The first color filter CF1 may overlap the first wavelength converter WLC1 in the thickness direction. The first color filter CF1 may selectively transmit light of a first color (for example, red light), and block or absorb light of a second color (for example, green light) and light of a third color (for example, blue light). For example, the first color filter CF1 may be a red color filter and include a red colorant.

The second color filter CF2 may be disposed in the second emission area LA2 on the third planarization layer OC3. The second color filter CF2 may be surrounded by the first light blocking part BK1. The second color filter CF2 may overlap the second wavelength converter WLC2 in the thickness direction. The second color filter CF2 may selectively transmit light of a second color (for example, green light), and block or absorb light of a first color (for example, red light) and light of a third color (for example, blue light). For example, the second color filter CF2 may be a green color filter and may include a green colorant.

The third color filter CF3 may be disposed in the third emission area LA3 on the third planarization layer OC3. The third color filter CF3 may be surrounded by the first light blocking part BK1. The third color filter CF3 may overlap the light transmitter LTU in the thickness direction. The third color filter CF3 may selectively transmit light of a third color (for example, blue light), and block or absorb light of a first color (for example, red light) and light of a second color (for example, green light). For example, the third color filter CF3 may be a blue color filter and may include a blue colorant.

Accordingly, the first to third color filters CF1, CF2, and CF may absorb a part of external light from the outside of the display device 10, thus reducing reflected light caused by the external light. Accordingly, the first to third color filters CF1, CF2, and CF3 may prevent color distortion due to reflection of external light.

The first to third color filters CF1, CF2, and CF3 may be disposed on or directly disposed on the third planarization layer OC3 of the wavelength conversion layer WLCL and thus the display device 10 may not need a separate substrate for the first to third color filters CF1, CF2 and CF3. Accordingly, the thickness of the display device 10 may be relatively reduced.

The third passivation layer PAS3 may cover or overlap the first to third color filters CF1, CF2, and CF3. The third passivation layer PAS3 may protect the first to third color filters CF1, CF2, and CF3.

The encapsulation layer TFE may be provided or disposed on the third passivation layer PAS3 of the color filter layer CFL. The encapsulation layer TFE may cover or overlap an upper surface of the color filter layer CFL and side surfaces of the color filter layer CFL and the wavelength conversion layer WLCL. For example, the encapsulation layer TFE may include at least one inorganic layer to prevent the permeation of oxygen or moisture. As an example, the encapsulation layer TFE may include at least one organic layer to protect the display device 10 from foreign matter such as dust.

The first pad portion PD1 may be provided or disposed on a lower surface of the substrate SUB. The first pad portion PD1 may be inserted into the second contact hole CNT2 passing through the substrate SUB to be electrically connected to the first connection line CWL1. The first pad portion PD1 may supply an electrical signal received from the flexible film FPCB through the second pad portion PD2 to the first connection line CWL1.

The second pad portion PD2 may be provided or disposed on the lower surface of the substrate SUB and spaced apart from the first pad portion PD1. The second pad portion PD2 may be electrically connected to the first pad portion PD1 through the lead line LDL. The second pad portion PD2 may receive various voltages or signals from the flexible film FPCB, and supply corresponding voltages or signals to the first pad portion PD1, the first connection line CWL1, and the second connection line CWL2.

The flexible film FPCB may be attached to the second pad portion PD2 through a connection film ACF. One surface or a surface of the connection film ACF may be attached to the second pad portion PD2 and the other or another surface thereof may be attached to the flexible film FPCB. For example, the connection film ACF may cover or overlap the entire second pad portion PD2 but embodiments are not limited thereto.

The connection film ACF may include an anisotropic conductive film. In case that the connection film ACF may include an anisotropic conductive film, the connection film ACF may have conductivity in a region in which the second pad portion PD2 and a contact pad of the flexible film FPCB are brought into electrical contact with each other, and may electrically connect the flexible film FPCB to the second pad portion PD2.

The flexible film FPCB may be disposed on the lower surface of the substrate SUB. One side or a side of the flexible film FPCB may be electrically connected to the second pad portion PD2 and the other side or another side thereof may be electrically connected to a source circuit board (not shown) on the lower surface of the substrate SUB. The flexible film FPCB may transmit a signal from the data driver SIC to the display device 10. For example, the data driver SIC may be an integrated circuit (IC). The data driver SIC may convert digital video data into an analog data voltage on the basis of a data control signal from a timing controller, and supply the analog data voltage to a data line of the display area DA through the flexible film FPCB.

Figure 4:
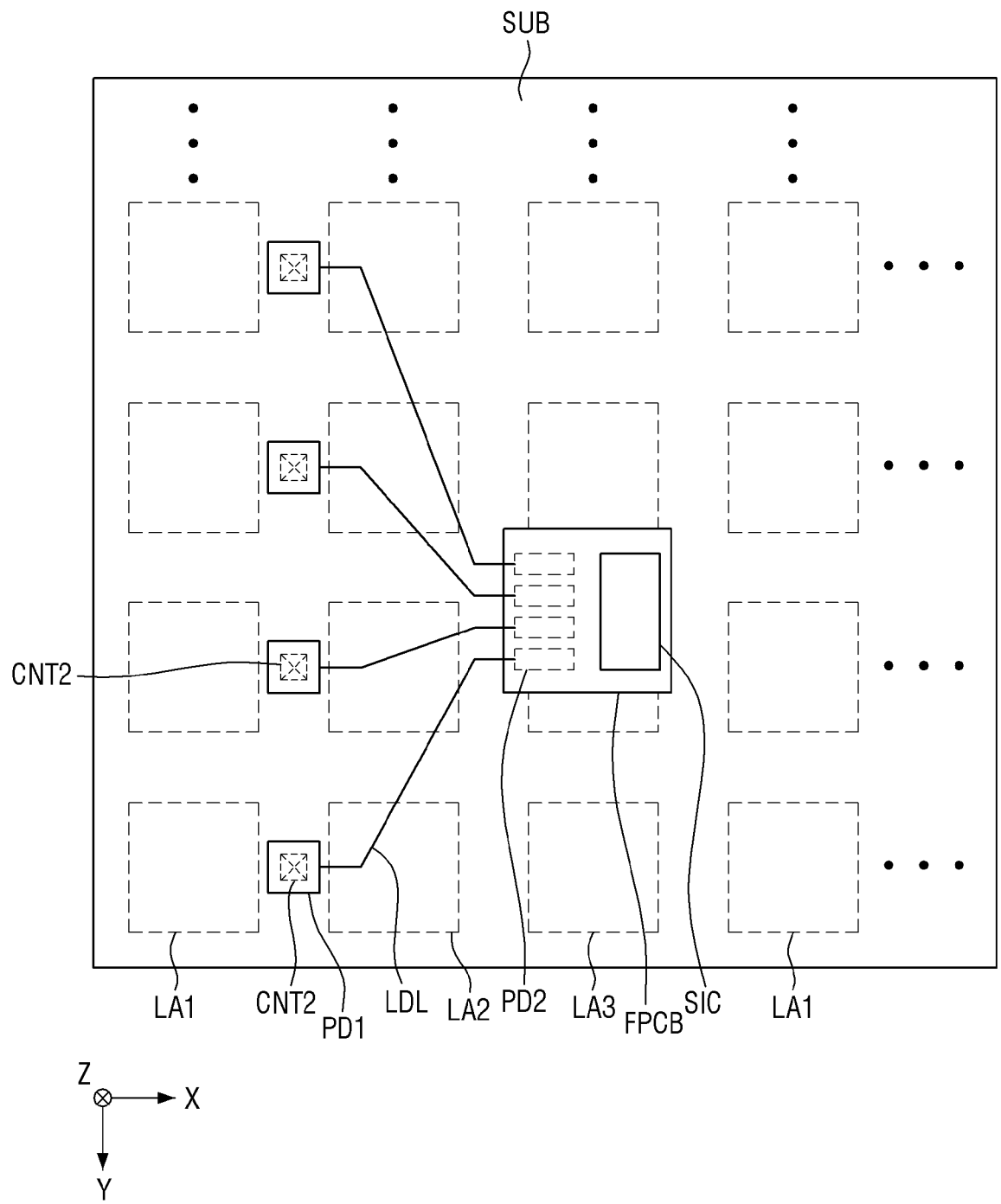
FIG. 4 is a bottom view of a display device according to an embodiment.

FIG. 4 is a bottom view of a display device according to an embodiment.

Referring to FIG. 4, the first pad portion PD1 may be provided or disposed on the lower surface of the substrate SUB. The first pad portion PD1 may be inserted into the second contact hole CNT2 to be electrically connected to the first connection line CWL1. The first pad portion PD1 may be provided or disposed between the first to third emission areas LA1, LA2, and LA3 but embodiments are not limited thereto. The first pad portion PD1 may supply an electrical signal received from the flexible film FPCB through the second pad portion PD2 to the first connection line CWL1.

The second pad portion PD2 may be provided or disposed on the lower surface of the substrate SUB and spaced apart from the first pad portion PD1. The second pad portion PD2 may be electrically connected to the first portion part PD1 through the lead line LDL. The second pad portion PD2 may receive various voltages or signals from the flexible film FPCB, and supply corresponding voltages or signals to the first connection line CWL1 through the first pad portion PD1.

The flexible film FPCB may be disposed on the lower surface of the substrate SUB. One side or a side of the flexible film FPCB may be electrically connected to the second pad portion PD2 and the other side or another side thereof may be electrically connected to a source circuit board (not shown) on the lower surface of the substrate SUB. The flexible film FPCB may transmit a signal from the data driver SIC to the display device 10.

Figure 5:
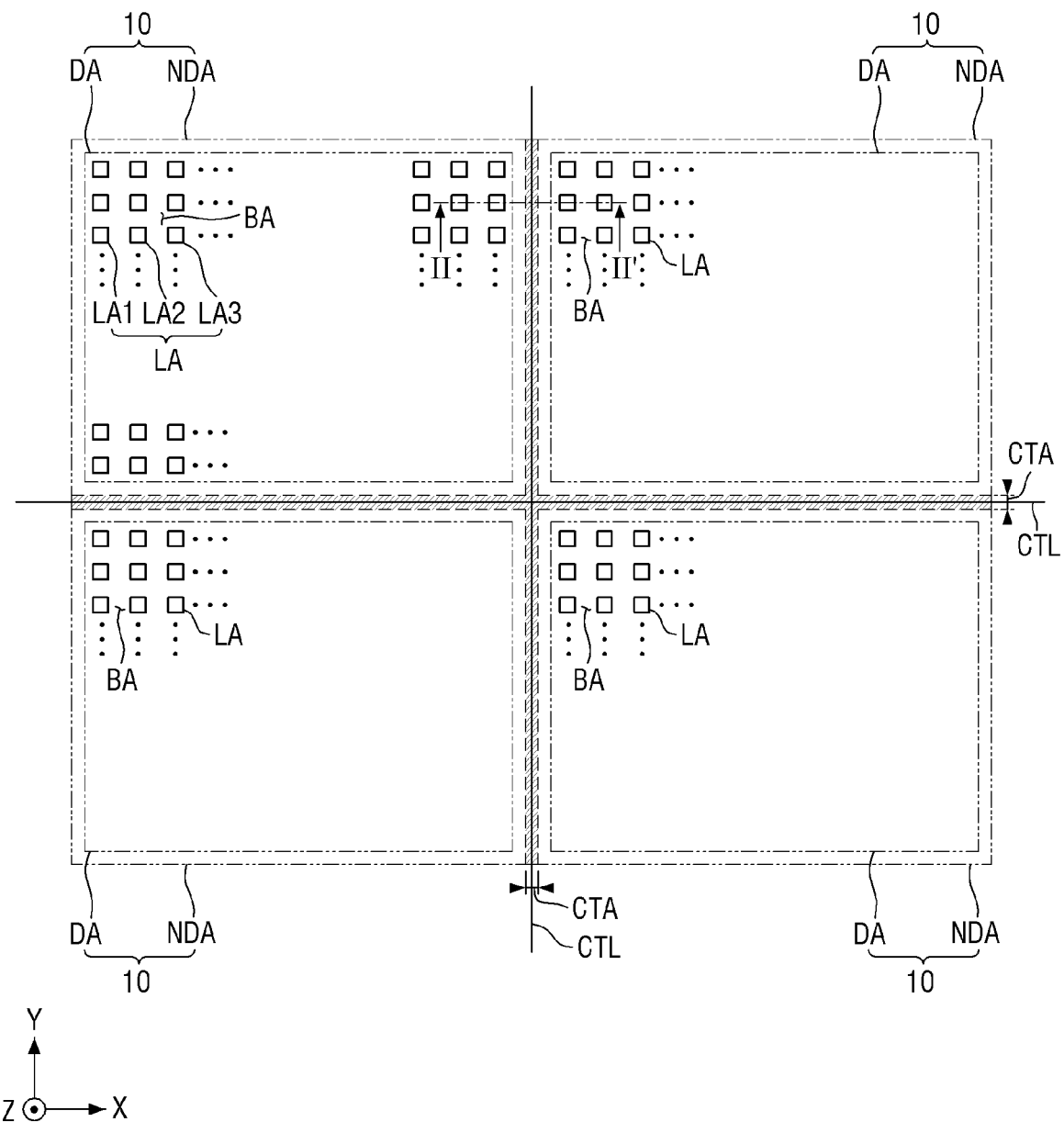
FIG. 5 is a schematic plan view of a cut area of display devices according to an embodiment.
Figure 6:
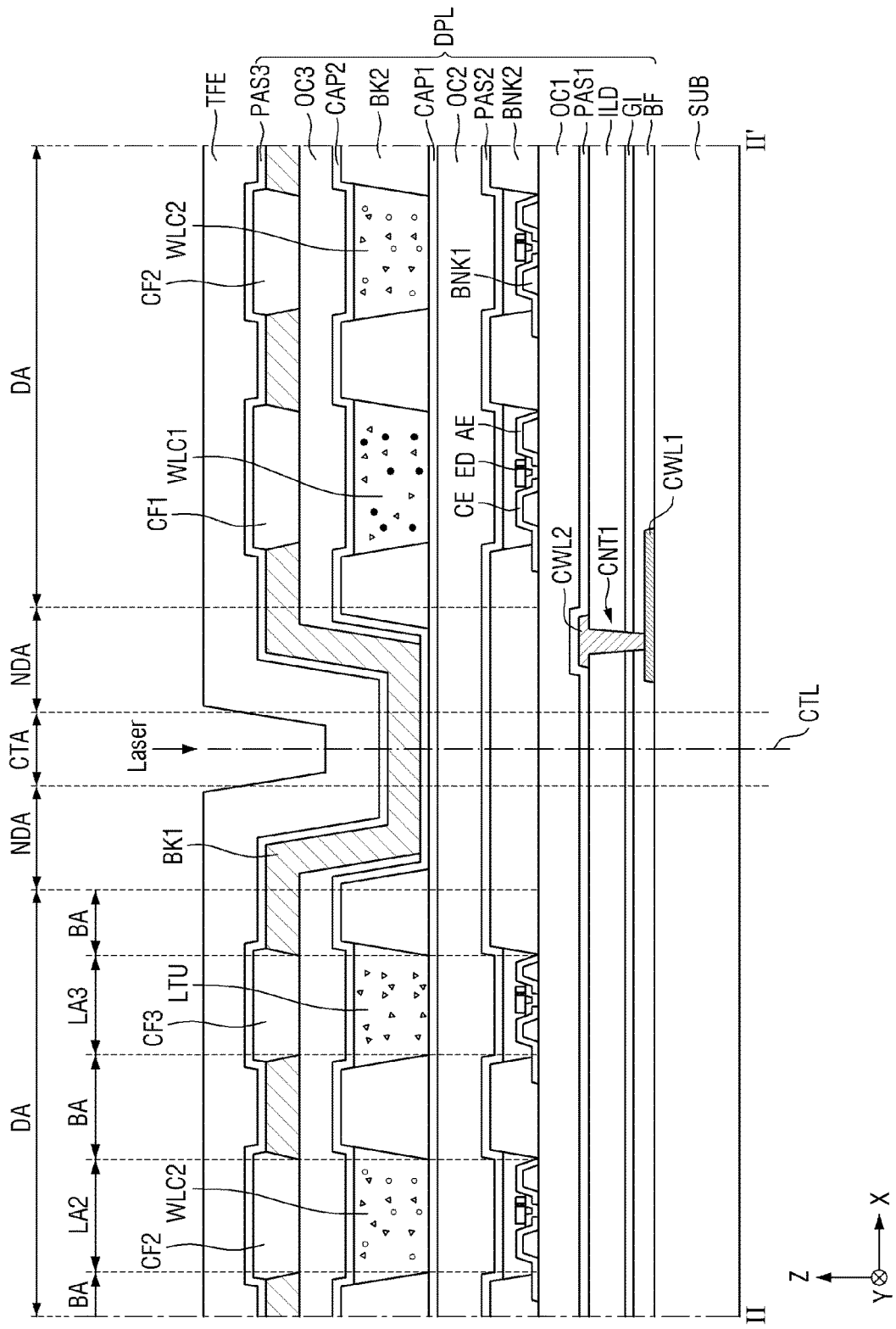
FIG. 6 is a schematic cross-sectional view taken along line II-II' of FIG. 5.
Figure 7:
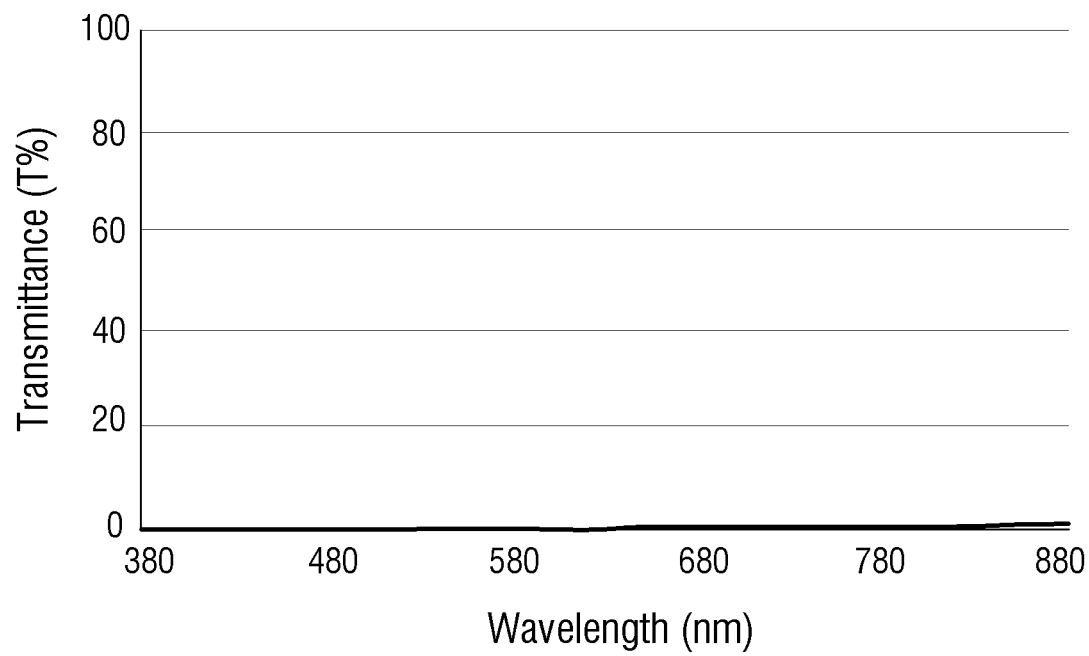
FIG. 7 is a graph showing transmittance of a light blocking part containing carbon black.
Figure 8:
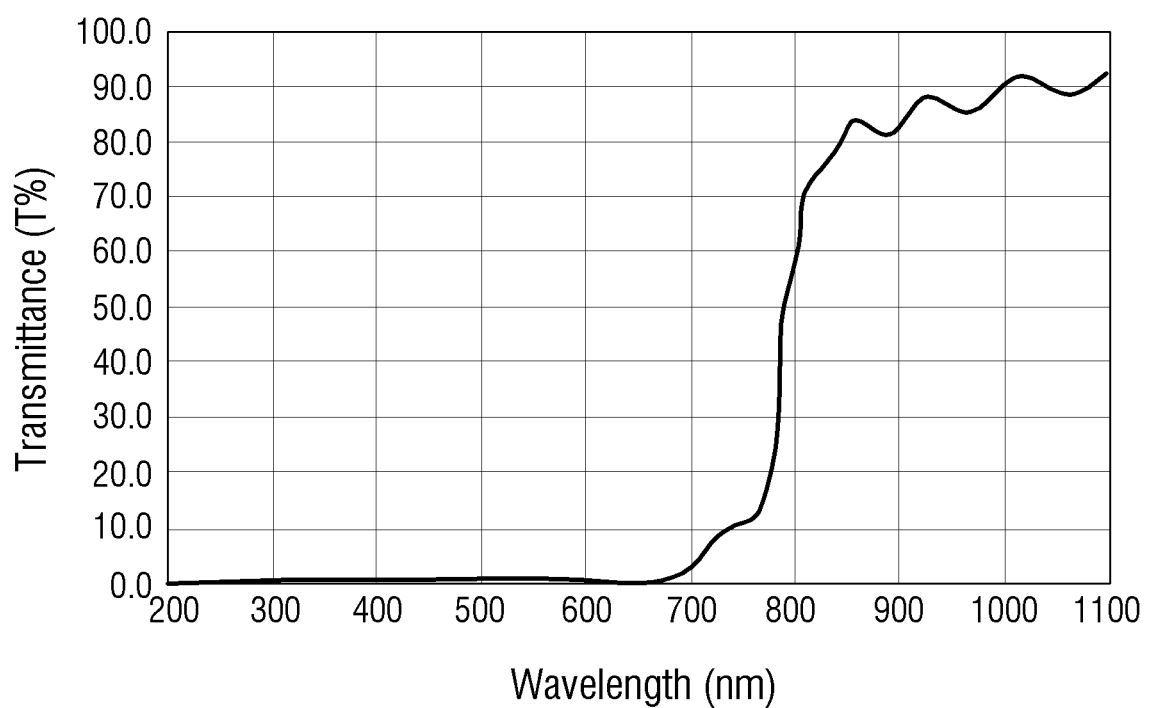
FIG. 8 is a graph showing transmittance of a light blocking part in a display device according to an embodiment.
Figure 9:
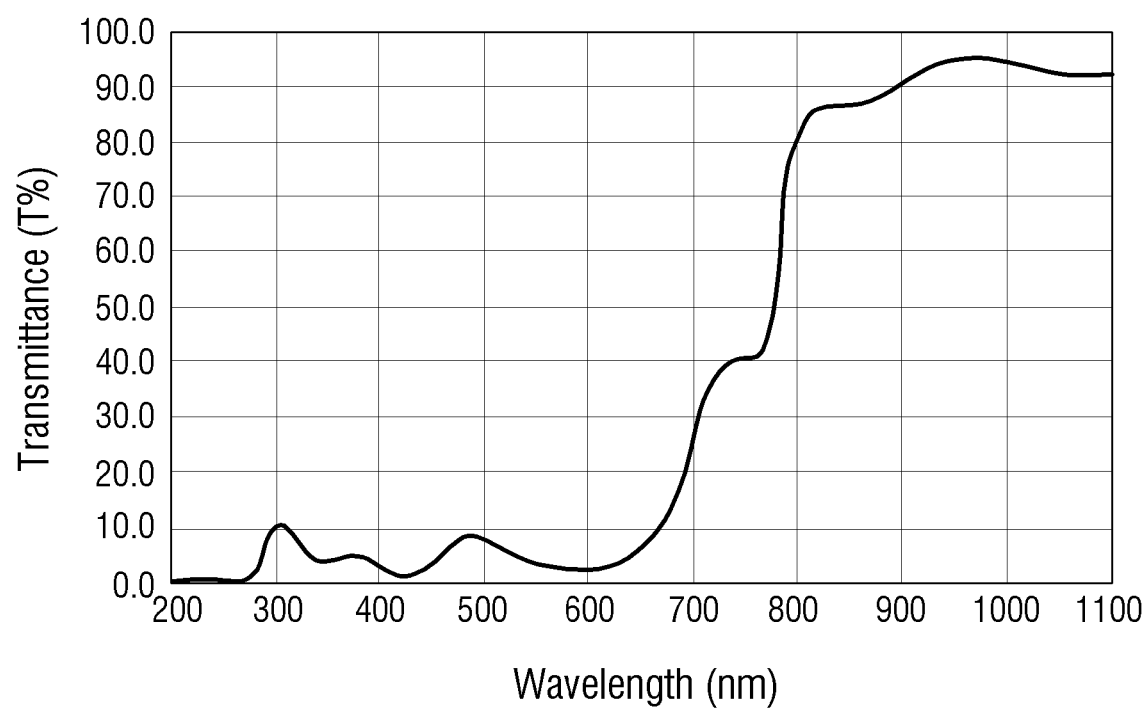
FIG. 9 is a graph showing transmittance of a light blocking part in a display device according to an embodiment.

FIG. 5 is a schematic plan view of a cut area of display devices according to an embodiment. FIG. 6 is a schematic cross-sectional view taken along line II-II' of FIG. 5. FIG. 7 is a graph showing the transmittance of a light blocking part including carbon black. FIG. 8 is a graph showing the transmittance of a light blocking part of a display device according to an embodiment. FIG. 9 is a graph showing the transmittance of a light blocking part of a display device according to an embodiment. Here, components having the same configurations as those of the above-described components will be briefly described or omitted.

Referring to FIGS. 5 to 9, display devices 10 may be formed by stacking a display layer DPL and an encapsulation layer TFE on one substrate SUB. A thin-film transistor layer TFTL, a light-emitting element layer EML, a wavelength conversion layer WLCL, a color filter layer CFL, and an encapsulation layer TFE may be sequentially stacked on a substrate SUB, and the display devices 10 may be separated from each other by a cutting process.

The display devices 10 may be cut along a cut line CTL by a cutting process using infrared laser. For example, the encapsulation layer TFE, a third passivation layer PAS3, a first light blocking part BK1, a second capping layer CAP2, a first capping layer CAP1, the light-emitting element layer EML, the thin-film transistor layer TFTL, and the substrate SUB may be cut by infrared laser. The first light blocking part BK1 may transmit infrared rays, thereby minimizing a region to which heat of laser is transmitted and a region which may be damaged by the laser. As transmittance of the first light blocking part BK1 with respect to infrared rays increases, a region which may be damaged by laser may be reduced.

A light blocking part as shown in FIGS. 7 to 9 may have a configuration and performance shown in Table 1 below. Infrared laser used in Table 1 below may have a wavelength of 1064 nm, a pulse width of 15 μs, a frequency of 33.3 kHz, a speed of 100 mm/s, a pitch of 3 μm, a beam wavelength of 1.6 μm or less, and a pulse energy of 9 μJ.

TABLE 1

|  | Light blocking part of FIG. 7 | Light blocking part of FIG. 8 | Light blocking part of FIG. 9 |
| --- | --- | --- | --- |
| Constituent material (PWC) | carbon black (47%) | organic black pigment (18%) + organic blue pigment (5%) | organic black pigment (4%) |
| Optical density (@550 nm, 1 μm) | 3.8 | 1.2 | 0.4 |
| Transmittance of infrared rays (@1064 nm) | 1% | 87% | 92% |
| Minimum thickness to block visible light | 1.0 μm | 3.0 μm | 5.0 μm |
| Width of heat-affected area (CTA) | 180 μm or less | 20 μm or less | 20 μm or less |

In FIG. 7, a light blocking part including carbon black is capable of blocking visible and infrared rays. The light blocking part including carbon black may have a transmittance of about 1% or less with respect to visible light and infrared rays. In a cutting process using infrared laser, a heat-affected area of the light blocking part may be damaged by heat of infrared laser. In case that the first light blocking part BK1 may include carbon black and does not transmit infrared rays, the heat of the infrared laser may be completely absorbed and a heat-affected area CTA may be relatively increased. The heat-affected area CTA may be physically damaged, thus increasing a tolerance of a cutting process and increasing an area of the non-display area NDA.

In FIG. 8, the display device 10 may include a first light blocking part BK1 including an organic black pigment and an organic blue pigment. The organic black pigment may include lactam black, perylene black, or aniline black, and for example, lactam black. The organic blue pigment may include at least one of C. I. Pigment Blue 15, 15:3, 15:4, 15:6, and 60, and for example, C. I. Pigment Blue 15:6.

A ratio of an amount of the organic black pigment to an amount of the organic blue pigment in the first light blocking part BK1 may be 3:1 to 4:1. A pigment weight concentration (PWC) of each of the organic black pigment and the organic blue pigment of the first light blocking part BK1 may be or a number 25% or less. For example, the PWC of the organic black pigment of the first light blocking part BK1 may be or a number 18%, and the PWC of the organic blue pigment may be or a number 5%. The ratio of the organic black pigment to the organic blue pigment may be 3.6:1 and the PWC of each of the organic black pigment and the organic blue pigment may be or a number 23%, but embodiments are not limited thereto.

The first light blocking part BK1 may block visible light and transmit infrared rays. A transmittance of the first light blocking part BK1 with respect to light having a wavelength of about 700 nm or less may be about 5% or less, and a transmittance thereof with respect to light having a wavelength of about 1000 nm or more may be about 80% or more. A transmittance of the first light blocking part BK1 with respect to light having a wavelength in a range of about 1000 nm to about 1100 nm may be about 87% or more. A thickness of the first light blocking part BK1 may be in a range of about 3 μm to about 12 μm, and for example, a range of about 3 μm to about 10 μm.

The first light blocking part BK1 may be cut along a cut line CTL by a cutting process using infrared laser during the manufacture of the display device 10. The first light blocking part BK1 transmits infrared rays, thus minimizing the heat-affected area CTA and an area damaged by laser. As the transmittance of the first light blocking part BK1 with respect to infrared rays increases, a region which may be damaged by laser may be reduced. Accordingly, the display device 10 may include the first light blocking part BK1 having a transmittance of about 87% or more with respect to light having a wavelength in a range of about 1000 nm to about 1100 nm and thus a region of the first light blocking part BK1 which may be damaged by a laser cutting process may be minimized, thereby reducing a tolerance of the laser cutting process and minimizing an area of the non-display area NDA.

In FIG. 9, the display device 10 may include a first light blocking part BK1 including an organic black pigment. The organic black pigment may include lactam black, perylene black, or aniline black, and for example, lactam black. A PWC of the organic black pigment of the first light blocking part BK1 may be about 6% or less, and for example, about 4% or less. The first light blocking part BK1 may block visible light and transmit infrared rays. A transmittance of the first light blocking part BK1 with respect to light having a wavelength of about 650 nm or less may be about 12% or less, and a transmittance thereof with respect to light having a wavelength of about 1000 nm or more may be about 90% or more. A transmittance of the first light blocking part BK1 with respect to light having a wavelength in a range of about 1000 nm to about 1100 nm may be about 92% or more. A thickness of the first light blocking part BK1 may be in a range of about 5 μm to about 12 μm, and for example, a range of about 5 μm to about 10 μm.

The first light blocking part BK1 may be cut along a cut line CTL by a cutting process using infrared laser during the manufacture of the display device 10. The first light blocking part BK1 transmits infrared rays, thus minimizing the heat-affected area CTA and an area damaged by laser. As the transmittance of the first light blocking part BK1 with respect to infrared rays increases, a region which may be damaged by laser may be reduced. Accordingly, the display device 10 may include the first light blocking part BK1 having a transmittance of about 92% or more with respect to light having a wavelength in a range of about 1000 nm to about 1100 nm and thus a region of the first light blocking part BK1 which may be damaged by a laser cutting process may be minimized, thereby reducing a tolerance of the laser cutting process and minimizing an area of the non-display area NDA.

Figure 10:
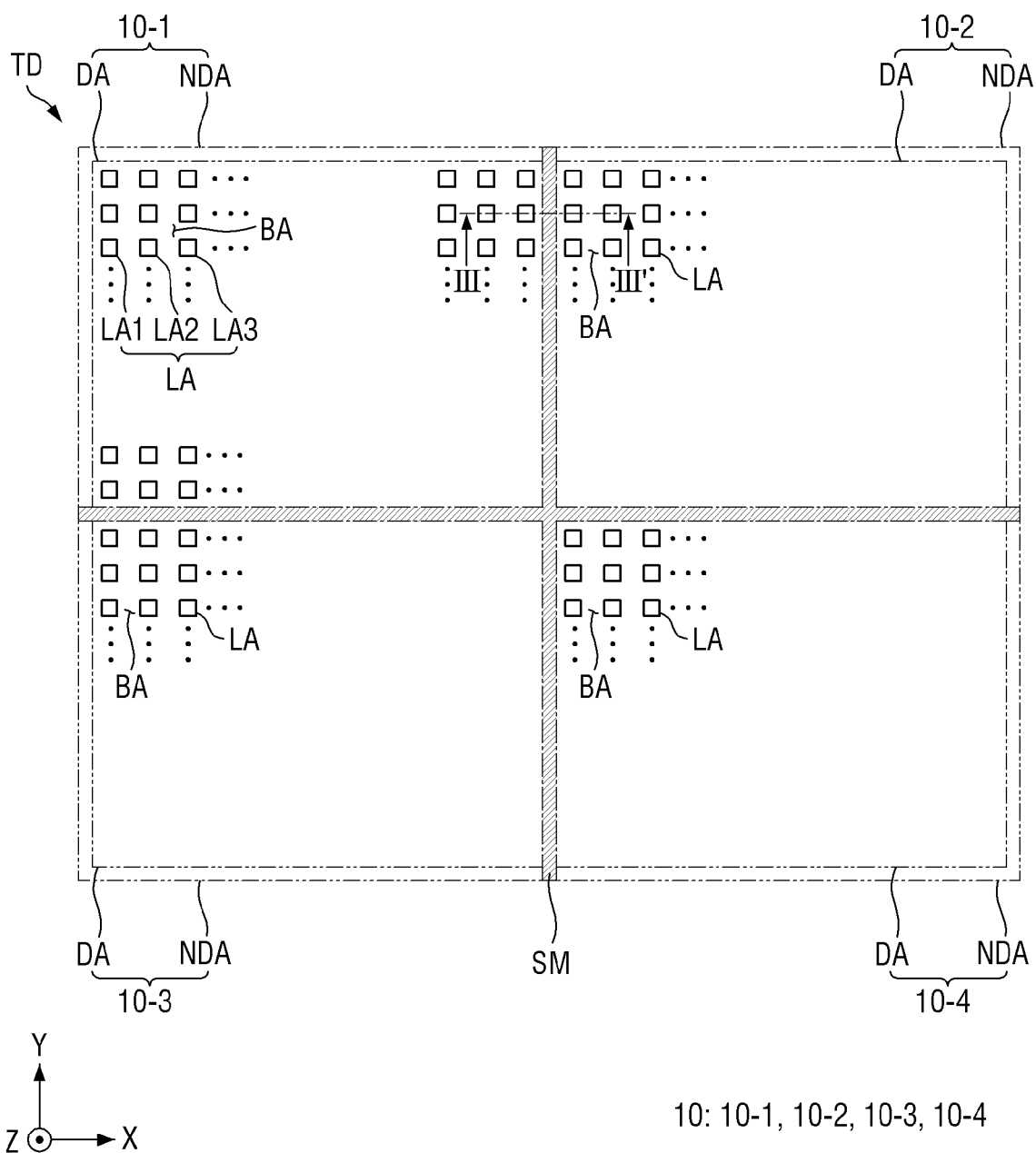
FIG. 10 is a schematic plan view of a combined structure of a tiled display device according to an embodiment.
Figure 11:
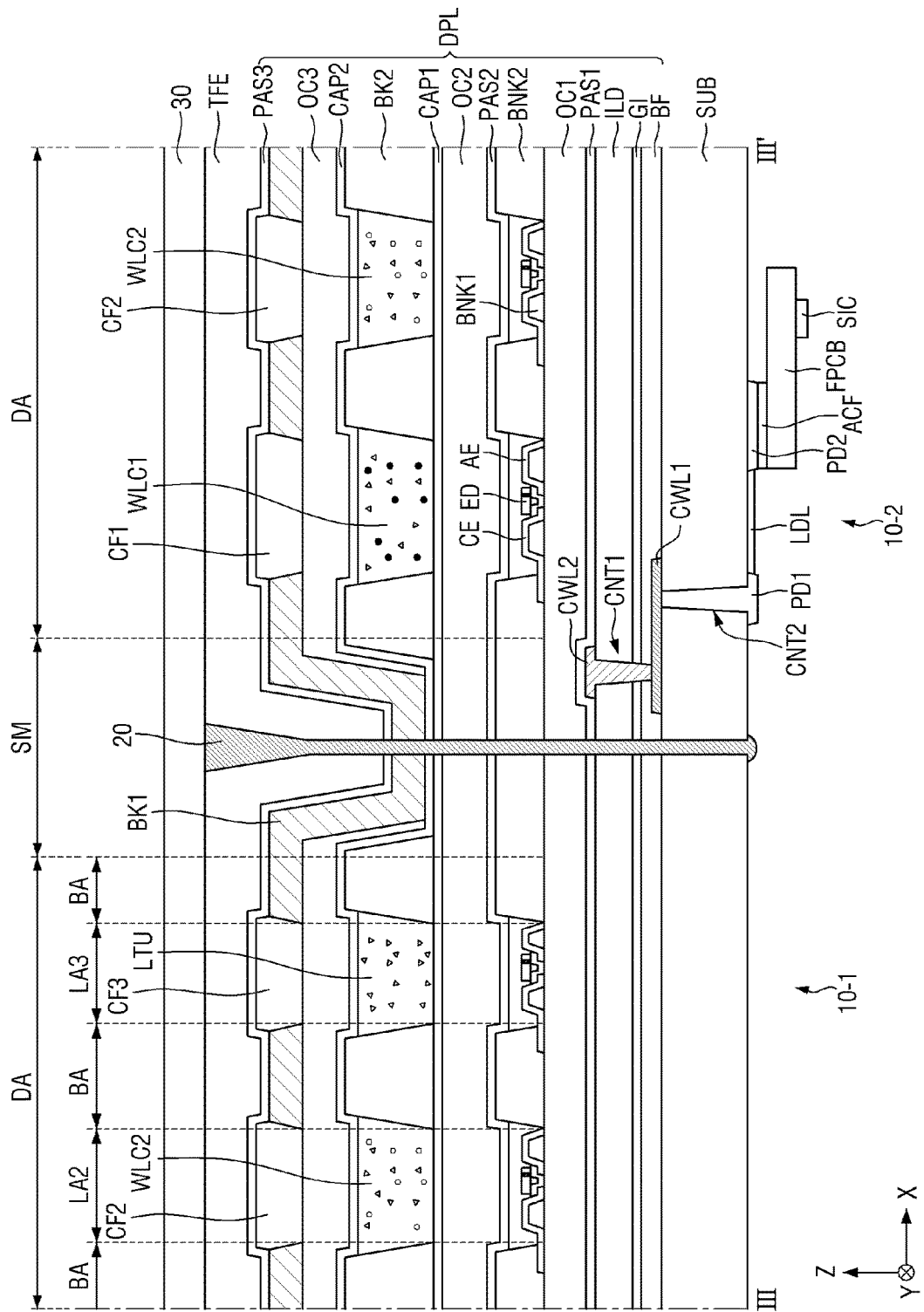
FIG. 11 is a schematic cross-sectional view taken along line III-III' of FIG. 10.

FIG. 10 is a schematic plan view of a combined structure of a tiled display device according to an embodiment. FIG. 11 is a schematic cross-sectional view taken along line III-III' of FIG. 10.

Referring to FIGS. 10 and 11, a tiled display device TD may include display devices 10, a coupling member 20, and a cover member 30. The display devices 10 may be arranged or disposed in a grid pattern but is not limited thereto. The display devices 10 may be connected in a first direction (X-axis direction) or a second direction (Y-axis direction), and the tiled display device TD may have a specific or given shape. For example, the display devices 10 may have the same size but are not limited thereto. As another example, the display devices 10 may have different sizes.

The tiled display device TD may include first to fourth display devices 10-1 to 10-4, for example 10-1, 10-2, 10-3, and 10-4. The number of display devices 10 and a coupling relationship therebetween are not limited to the embodiment of FIG. 10. The number of display devices 10 may be determined by sizes of the display devices 10 and the tiled display device TD.

Each of the display devices 10 may include a display area DA and a non-display area NDA. The display area DA may include pixels for displaying an image. The non-display area NDA may be provided or disposed near the display area DA to surround or to be adjacent to the display area DA and may not display an image.

The tiled display device TD may include a combining area SM between the display areas DA. The tiled display device TD may be formed by connecting the non-display areas NDA of adjacent display devices 10. The display devices 10 may be connected to each other through the coupling member 20 or an adhesive member provided or disposed in the combining area SM. The combining area SM of each of the display devices 10 may not include a pad portion or a flexible film attached to the pad portion. Accordingly, the distance between the display areas DA of the display devices 10 may be so small that the combining area SM between the display devices 10 is not recognizable to a user. The reflectance of external light of the display area DA of each of the display devices 10 and the reflectance of external light of the combining area SM between the display devices 10 may be substantially the same. Accordingly, in the tiled display device TD, the combining area SM between the display devices 10 may be prevented from being recognized by a user, thereby reducing a sense of discontinuity between the display devices 10 and improving a sense of immersion in an image.

The display device 10 may include pixels arranged or disposed in rows and columns in the display area DA. Each of the pixels may include an emission area LA defined by a pixel defining film or bank, and light having a certain or given peak wavelength may be emitted through the emission area LA. For example, the display area DA of the display device 10 may include a first emission area LA1, a second emission area LA2, and a third emission area LA3. Each of the first to third light emitting areas LA1, LA2, and LA3 may be areas through which light generated by a light-emitting element of the display device 10 is emitted to the outside of the display device 10.

The first to third emission areas LA1, LA2, and LA3 may be sequentially and repeatedly disposed in a first direction (X-axis direction) of the display area DA. For another example, an area of the first emission area LA1 may be greater than that of the second emission area LA2, and the area of the second emission area LA2 may be greater than that of the third emission area LA3. As another example, the area of the first emission area LA1, the area of the second emission area LA2, and the area of the third emission area LA3 may be substantially the same.

The display area DA of the display device 10 may include a light blocking area BA surrounding the emission areas LA. The light blocking area BA may prevent light emitted from the first to third emission areas LA1, LA2, and LA3 from being mixed.

For example, the first light blocking part BK1 may include an organic black pigment and an organic blue pigment. A ratio of an amount of the organic black pigment to an amount of the organic blue pigment in the first light blocking part BK1 may be 3:1 to 4:1. A pigment weight concentration (PWC) of each of the organic black pigment and the organic blue pigment of the first light blocking part BK1 may be about 25% or less. A PWC of the organic black pigment of the first light blocking part BK1 may be about 18% and a PWC of the organic blue pigment may be about 5%. A transmittance of the first light blocking part BK1 with respect to light having a wavelength in a range of 1000 nm to about 1100 nm may be about 87% or more. A thickness of the first light blocking part BK1 may be in a range of about 3 μm to about 12 μm, and for example, a range of about 3 μm to about 10 μm.

The display device 10 may include the first light blocking part BK1 having a transmittance of about 87% or more with respect to light having a wavelength in a range of about 1000 nm to about 1100 nm and thus a region of the first light blocking part BK1 which may be damaged by a laser cutting process may be minimized, thereby reducing a tolerance of the laser cutting process and minimizing an area of the non-display area NDA. Accordingly, the tiled display device TD may include the first light blocking part BK1 having a transmittance of about 87% or more with respect to light having a wavelength in a range of about 1000 nm to about 1100 nm, thus minimizing an area of the combining area SM, and therefore, the combining area SM may be prevented from being recognized by a user, a sense of discontinuity between the display devices 10 may be improved, and a sense of immersion in an image may be improved.

As another example, the first light blocking part BK1 may include an organic black pigment. A PWC of the organic black pigment of the first light blocking part BK1 may be about 6% or less, and for example, about 4% or less. A transmittance of the first light blocking part BK1 with respect to light having a wavelength in a range of about 1000 nm to about 1100 nm may be about 92% or more. A thickness of the first light blocking part BK1 may be in a range of about 5 μm to about 12 μm, and for example, a range of about 5 μm to about 10 μm.

The display device 10 may include the first light blocking part BK1 having a transmittance of about 92% or more with respect to light having a wavelength in a range of about 1000 nm to about 1100 nm and thus a region of the first light blocking part BK1 which may be damaged by a laser cutting process may be minimized, thereby reducing a tolerance of the laser cutting process and minimizing an area of the non-display area NDA. Accordingly, the tiled display device TD may include the first light blocking part BK1 having a transmittance of about 92% or more with respect to light having a wavelength in a range of about 1000 nm to about 1100 nm, thus minimizing an area of the combining area SM, and therefore, the combining area SM may be prevented from being recognized by a user, a sense of discontinuity between the display devices 10 may be improved, and a sense of immersion in an image may be improved.

In the tiled display device TD, side surfaces of adjacent display devices 10 may be combined using coupling members 20 between the display devices 10. The tiled display device TD may be achieved by connecting side surfaces of the first to fourth display devices 10-1 to 10-4 arranged or disposed in the grid pattern through the coupling members 20. Side surfaces of the substrate SUB, side surfaces of the thin-film transistor layers TFTL, side surfaces of the light-emitting element layers EML, side surfaces of first and second capping layers CAP1 and CAP2, side surfaces of the first light blocking parts BK1, side surfaces of the third passivation layers PAS3, and side surfaces of the encapsulation layers TFE of adjacent display devices 10 may be combined through the coupling member 20.

For example, the coupling member 20 may be an adhesive or double-sided tape having a relatively thin thickness, thereby minimizing gaps between the display devices 10. As another example, the coupling member 20 may be a coupling frame having a relatively thin thickness, thereby minimizing gaps between the display devices 10. Accordingly, in the tiled display device TD, the combining area SM between the display devices 10 may be prevented from being recognized by a user.

The cover member 30 may be provided or disposed on upper surfaces of the display devices 10 and the coupling member 20 to cover or overlap the display devices 10 and the coupling member 20. For example, the cover member 30 may be provided or disposed on an upper surface of the encapsulation layer TFE of each of the display devices 10. The cover member 30 may protect the upper surface of the tiled display device TD.

According to a display device and a tiled display device including the same according to embodiments, a light blocking part that transmits infrared rays can be cut using infrared laser to minimize a heat-affected area of the light blocking part, thereby reducing a tolerance of a cutting process and minimizing an area of a non-display area. Accordingly, in the tiled display device, an area of a combining area can be minimized to prevent the combining area from being recognized by a user, improve a sense of discontinuity between display devices, and improve a sense of immersion in an image.

Effects according to embodiments are not limited by the above description and other various effects are included in the disclosure.

What is claimed is:

1. A display device comprising:
   a substrate including:
      a display area including emission areas and a light blocking area; and
      a non-display area adjacent to the display area;
   a thin-film transistor layer disposed on the substrate, the thin-film transistor layer comprising thin-film transistors;
   a light-emitting element layer disposed on the thin-film transistor layer, the light-emitting element layer comprising light-emitting elements;
   a wavelength conversion layer disposed on the light-emitting element layer that converts a peak wavelength of a light from at least a part of the light-emitting elements; and
   a color filter layer disposed on the wavelength conversion layer, the color filter layer comprising:
      color filters corresponding to the emission areas; and
      a first light blocking part corresponding to the light blocking area and the non-display area,
   wherein a transmittance of the first light blocking part with respect to a light having a wavelength of about 1000 nm or more is about 80% or more.

2. The display device of claim 1, wherein the first light blocking part comprises an organic black pigment and an organic blue pigment.

3. The display device of claim 2, wherein
   the organic black pigment comprises lactam black, and
   the organic blue pigment comprises C. I. Pigment Blue 15:6.

4. The display device of claim 2, wherein a ratio of an amount of the organic black pigment to an amount of the organic blue pigment in the first light blocking part is about 3:1 to about 4:1.

5. The display device of claim 2, wherein a pigment weight concentration of the organic black pigment and the organic blue pigment of the first light blocking part is about 25% or less.

6. The display device of claim 2, wherein the first light blocking part has a thickness in a range of about 3 μm to about 12 μm.

7. The display device of claim 6, wherein a transmittance of the first light blocking part with respect to a light having a wavelength in a range of about 1000 nm to about 1100 nm is about 87% or more.

8. The display device of claim 1, wherein the first light blocking part comprises an organic black pigment of lactam black.

9. The display device of claim 8, wherein a pigment weight concentration of the organic black pigment is about 6% or less.

10. The display device of claim 8, wherein the first light blocking part has a thickness in a range of about 5 μm to about 12 μm.

11. The display device of claim 10, wherein a transmittance of the first light blocking part with respect to a light having a wavelength in a range of about 1000 nm to about 1100 nm is about 92% or more.

12. The display device of claim 1, wherein the wavelength conversion layer comprises:
   a wavelength converter corresponding to a part of the emission areas;
   a light transmitter corresponding to another part of the emission areas; and
   a second light blocking part surrounding the wavelength converter and the light transmitter in a plan view.

13. The display device of claim 12, wherein the first light blocking part is disposed on the second light blocking part in the light blocking area, and disposed in the non-display area to surround a side surface of the wavelength conversion layer.

14. A tiled display device comprising:
   display devices including:
      a display area including emission areas and a light blocking area; and
      a non-display area adjacent to the display area; and
   a coupling member that combines the display devices,
   wherein
   each of the display devices comprises:
      a substrate;
      a thin-film transistor layer disposed on the substrate, the thin-film transistor layer comprising thin-film transistors;
      a light-emitting element layer disposed on the thin-film transistor layer, the light-emitting element layer comprising light-emitting elements;
   a wavelength conversion layer disposed on the light-emitting element layer and converting a peak wavelength of a light from at least a part of the light-emitting elements; and
      a color filter layer disposed on the wavelength conversion layer, the color filter layer comprising color filters corresponding to the emission areas and a first light blocking part corresponding to the light blocking area and the non-display area, and
   a transmittance of the first light blocking part with respect to a light having a wavelength of about 1000 nm or more is about 80% or more.

15. The tiled display device of claim 14, wherein the first light blocking part comprises an organic black pigment of lactam black and an organic blue pigment of C. I. Pigment Blue 15:6.

16. The tiled display device of claim 15, wherein a ratio of an amount of the organic black pigment to an amount of the organic blue pigment in the first light blocking part is about 3:1 to about 4:1.

17. The tiled display device of claim 15, wherein a pigment weight concentration of the organic black pigment and the organic blue pigment of the first light blocking part is about 25% or less.

18. The tiled display device of claim 14, wherein the first light blocking part comprises an organic black pigment of lactam black.

19. The tiled display device of claim 18, wherein a pigment weight concentration of the organic black pigment is about 6% or less.

20. The tiled display device of claim 14, wherein side surfaces of the substrate of each of adjacent display devices of the display devices, side surfaces of the thin-film transistor layer of each of the adjacent display devices, side surfaces of the light-emitting element layer of each of the adjacent display devices, and side surfaces of the color filter layer of each of the adjacent display devices are combined by the coupling member.

* * * * *